US011101383B2

(12) United States Patent
Nishiwaki

(10) Patent No.: US 11,101,383 B2
(45) Date of Patent: Aug. 24, 2021

(54) SEMICONDUCTOR DEVICE WITH REDUCED ELECTRIC FIELD CROWDING

(71) Applicants: Kabushiki Kaisha Toshiba, Tokyo (JP); Toshiba Electronic Devices & Storage Corporation, Tokyo (JP)

(72) Inventor: Tatsuya Nishiwaki, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/298,210

(22) Filed: Mar. 11, 2019

(65) Prior Publication Data
US 2020/0091338 A1  Mar. 19, 2020

(30) Foreign Application Priority Data
Sep. 18, 2018 (JP) .............................. JP2018-174320

(51) Int. Cl.
*H01L 29/78* (2006.01)
*H01L 29/10* (2006.01)
*H01L 29/40* (2006.01)

(52) U.S. Cl.
CPC ...... *H01L 29/7813* (2013.01); *H01L 29/1095* (2013.01); *H01L 29/404* (2013.01); *H01L 29/407* (2013.01)

(58) Field of Classification Search
CPC ............... H01L 29/7813; H01L 29/407; H01L 29/1095; H01L 29/404
See application file for complete search history.

(56) References Cited

U.S. PATENT DOCUMENTS 8,872,257 B1  10/2014 Matsuoka et al.
8,884,364 B2  11/2014 Nishiwaki
(Continued)

FOREIGN PATENT DOCUMENTS

| JP | 5580150 B2    | 8/2014 |
| JP | 2017-123432 A | 7/2017 |
| JP | 6271155 B2    | 1/2018 |

*Primary Examiner* — Phat X Cao
(74) *Attorney, Agent, or Firm* — White & Case LLP

(57) ABSTRACT

A semiconductor device of an embodiment includes: a first semiconductor layer of a first conductive type; a second semiconductor layer of the first conductive type, being provided on the first semiconductor layer and including a first trench, a plurality of holes, a plurality of second trenches, and a plurality of third trenches; a first semiconductor region of a second conductive type, being provided on the second semiconductor layer; a second semiconductor region of the first conductive type, being provided on the first semiconductor region; a first electrode electrically connected to the second semiconductor region; a second electrode disposed in the first trench via a first insulation film; a plurality of first field plate electrodes having a column shape, being electrically connected to the first electrode, interposing the second electrode, and being disposed in the holes via a second insulation film; a plurality of third electrodes extending from ends of the first insulation films in a first direction to the first direction, being disposed in the second trenches via third insulation films and extending from ends of the second electrodes in the 1st direction to the first direction; a plurality of second field plate electrodes extending in the first direction, being apart from the first field plate electrodes, being disposed in the third trenches via fourth insulation films, being electrically connected to the first field plate electrode via the first electrode, and interposing the third electrode; and a fourth electrode electrically connecting the second electrode and the third electrode.

22 Claims, 12 Drawing Sheets

(56) References Cited

U.S. PATENT DOCUMENTS

2014/0332879 A1* 11/2014 Henson ................ H01L 29/407
                                                              257/330
2017/0110573 A1* 4/2017 Laforet ............... H01L 29/1095
2017/0200818 A1    7/2017 Suzuki et al.
2019/0006513 A1* 1/2019 Ouvrard ................ H01L 29/407

* cited by examiner

SEMICONDUCTOR DEVICE WITH REDUCED ELECTRIC FIELD CROWDING

CROSS-REFERENCE TO RELATED APPLICATION

This application is based upon and claims the benefit of priority from Japanese Patent Application No. 2018-174320, filed on Sep. 18, 2018, the entire contents of which are incorporated herein by reference.

FIELD

Embodiments described herein relate generally to a semiconductor device.

BACKGROUND

As a known structure configured to improve withstand voltage of cells and ON resistance of a power metal-oxide semiconductor field-effect transistor (MOSFET) in a trench-based field plate electrode structure includes a structure in which field plate electrodes are embedded in stripe-pattern trenches. In addition, in order to reduce the ON resistance, a power MOSFET having a dot trench-based field plate structure is known. The dot trench-based field plate structure has field plate electrodes arranged in a dot pattern to reduce an ineffective area in which an ON current does not flow.

However, even though the withstand voltage is improved in an element region, there is a problem that gate lines in a terminal region tend to be destroyed due to electric field crowding where reverse bias is applied to a drain-source terminal.

DETAILED DESCRIPTION

Figure 1:
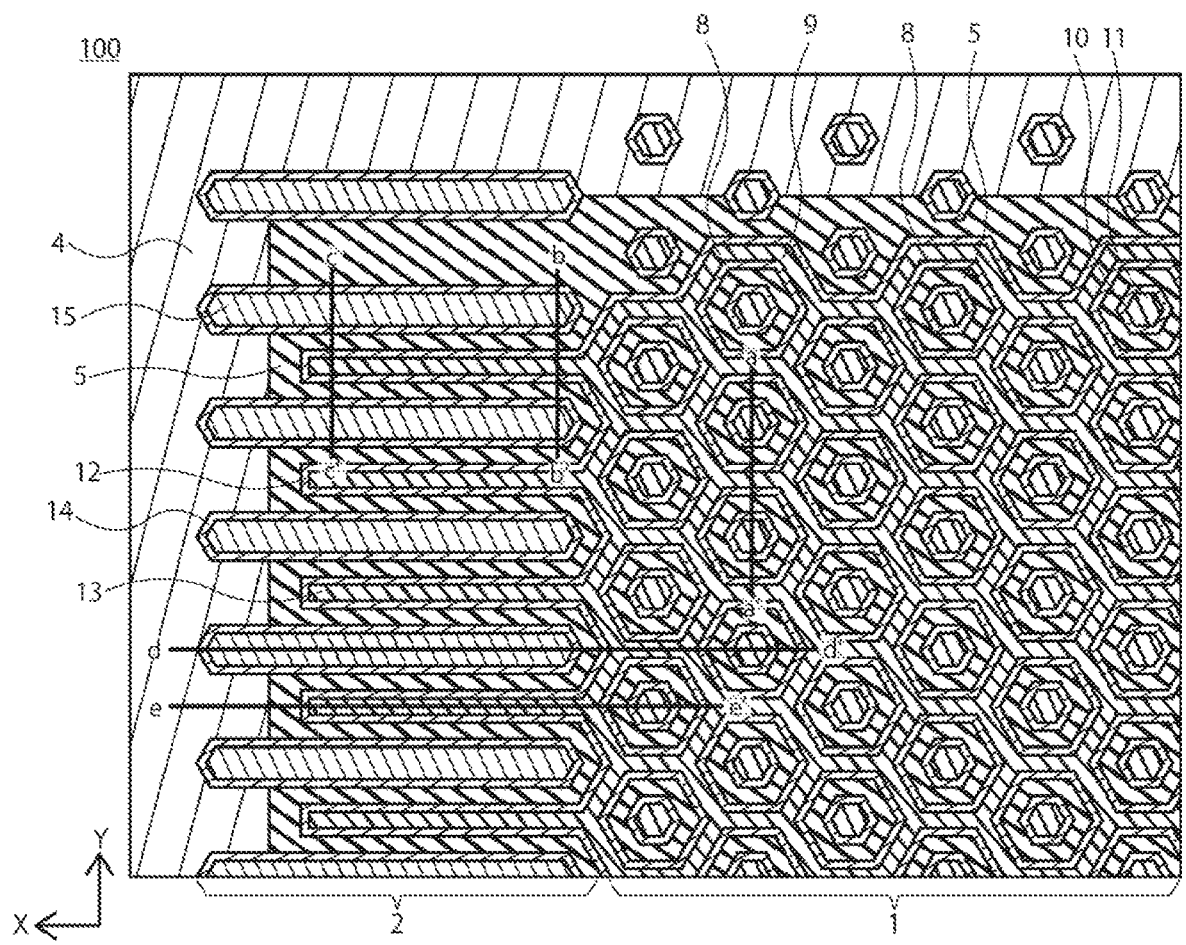
FIG. 1 is a drawing illustrating a principal portion of a semiconductor device 100 according to an embodiment.

A semiconductor device of an embodiment includes: a first semiconductor layer of a first conductive type; a second semiconductor layer of the first conductive type, the second semiconductor layer being provided on the first semiconductor layer and including a first trench, a plurality of holes, a plurality of second trenches, and a plurality of third trenches; a first semiconductor region of a second conductive type, the first semiconductor region being provided on the second semiconductor layer; a second semiconductor region of the first conductive type, the second semiconductor region being provided on the first semiconductor region; a first electrode electrically connected to the second semiconductor region; a second electrode disposed in the first trench via a first insulation film; a plurality of first field plate electrodes having a column shape, the first field plate electrodes being electrically connected to the first electrode, interposing the second electrode, and being disposed in the holes via a second insulation film; a plurality of third electrodes extending from ends of the first insulation films in a first direction to the first direction, the third electrodes being disposed in the second trenches via third insulation films and extending from ends of the second electrodes in the first direction to the first direction; a plurality of second field plate electrodes extending in the first direction, the second field plate electrodes being apart from the first field plate electrodes, being disposed in the third trenches via fourth insulation films, being electrically connected to the first field plate electrode via the first electrode, and interposing the third electrode; and a fourth electrode electrically connecting the second electrode and the third electrode.

Referring now to the drawings, an embodiment of this disclosure will be descried below. Note that in the drawings attached to this specification, the scales and the dimensional ratios in the length and breadth are appropriately changed from those of the actual ones and exaggerated for convenience of illustration and ease of understanding.

Embodiments will be described below with reference to the drawings. Note that the same or similar portions are designated by the same or similar reference numerals throughout the drawings.

In this specification, the same or similar members may be designated by the same reference numerals and overlapped description may be omitted.

In this specification, to indicate the positional relationship of components etc., the upward direction of the drawing is described as "above" and the downward direction of the drawing as "below". The concepts of "above" and "below" in this specification are not necessarily intended to indicate the relationship with respect to the direction of gravity.

Further, terms specifying shapes, geometrical conditions and degrees thereof, such as "parallel", "orthogonal", and "same" and the like, and values of the length or the angle and the like are interpreted to include a range that can be expected to achieve similar functions without being bound by strict meanings.

In this specification, signs such as n+, n, n− and p+, p, p− are intended to indicate relative levels of concentration of impurities in respective conductive types. In other words, n+ indicates that the concentration of impurities of n-type is relatively higher than n, and n− indicates that the concentration of impurities of n type is relatively lower than n. Likewise, p+ indicates that the concentration of impurities of p-type is relatively higher than p, and p− indicates that the concentration of impurities of p type is relatively lower than p. Note that n+ and n− may be simply referred to as n-type and p+ and p− may be simply referred to as p-type.

In the following description, a first conductive type corresponds to the n-type and a second conductive type corresponds to the p-type. However, it is needless to say that the embodiments may be preferably carried out even though the first conductive type is p-type and the second conductive type is n-type.

First Embodiment

Figure 2A:
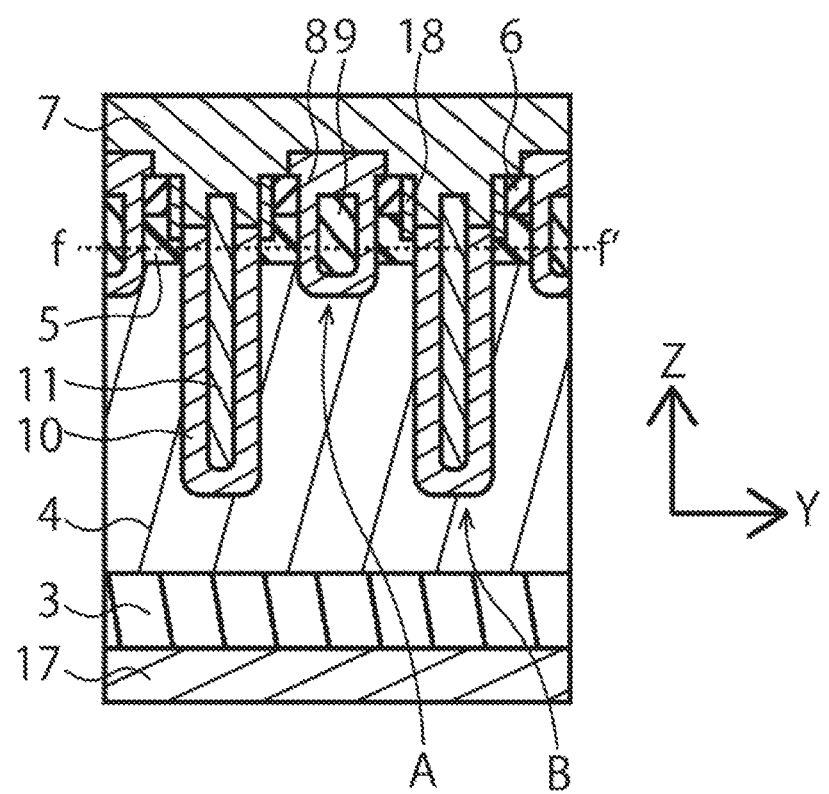
FIG. 2A is a cross-sectional view taken along a line a-a' in FIG. 1.
Figure 2B:
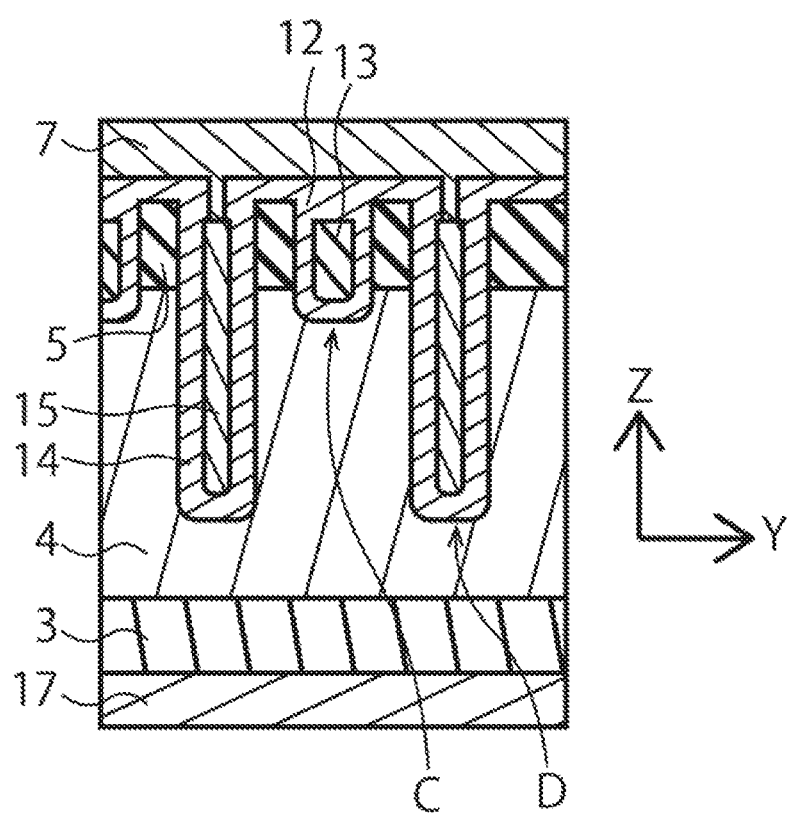
FIG. 2B is a cross-sectional view taken along a line b-b' in FIG. 1.
Figure 2C:
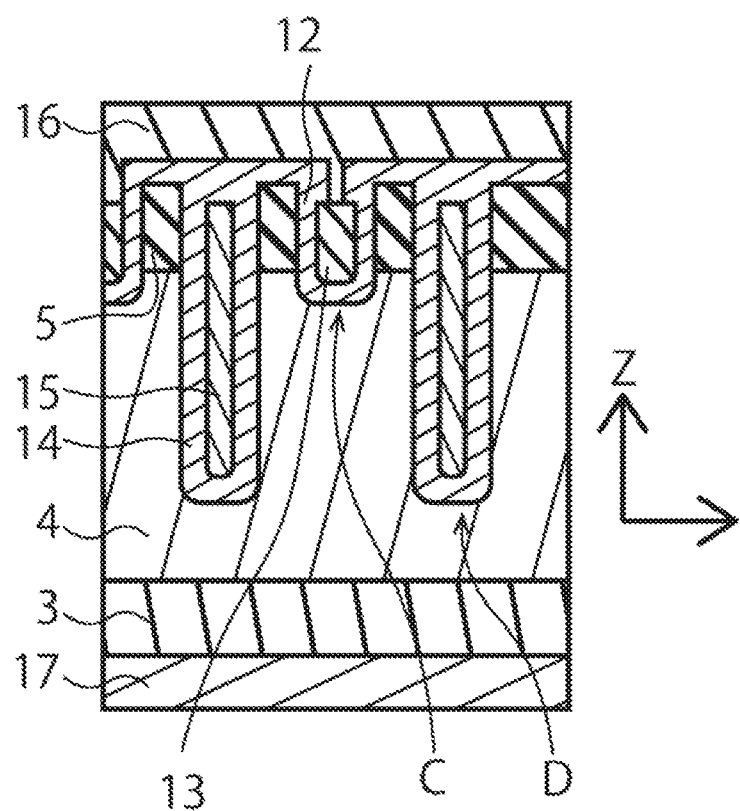
FIG. 2C is a cross-sectional view taken along a line c-c' in FIG. 1.
Figure 3A:
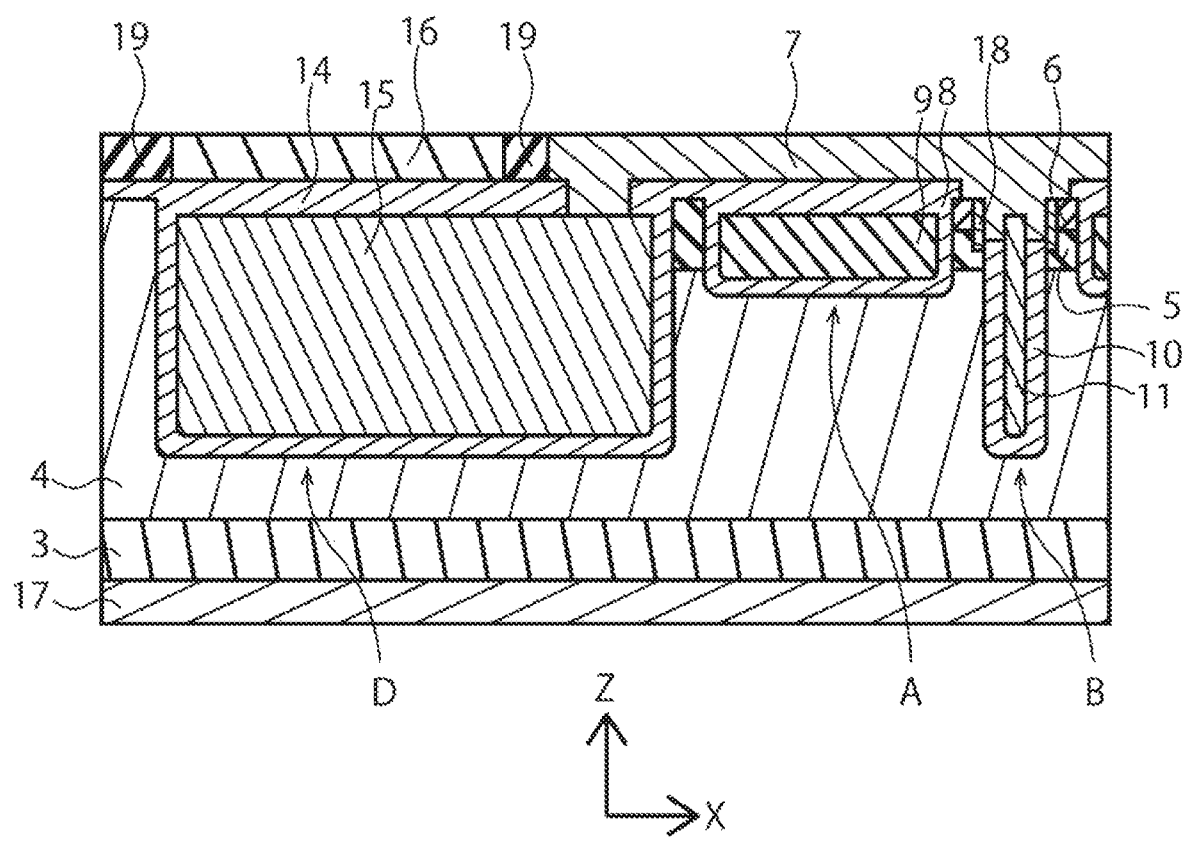
FIG. 3A is a cross-sectional view taken along a line d-d' in FIG. 1.
Figure 3B:
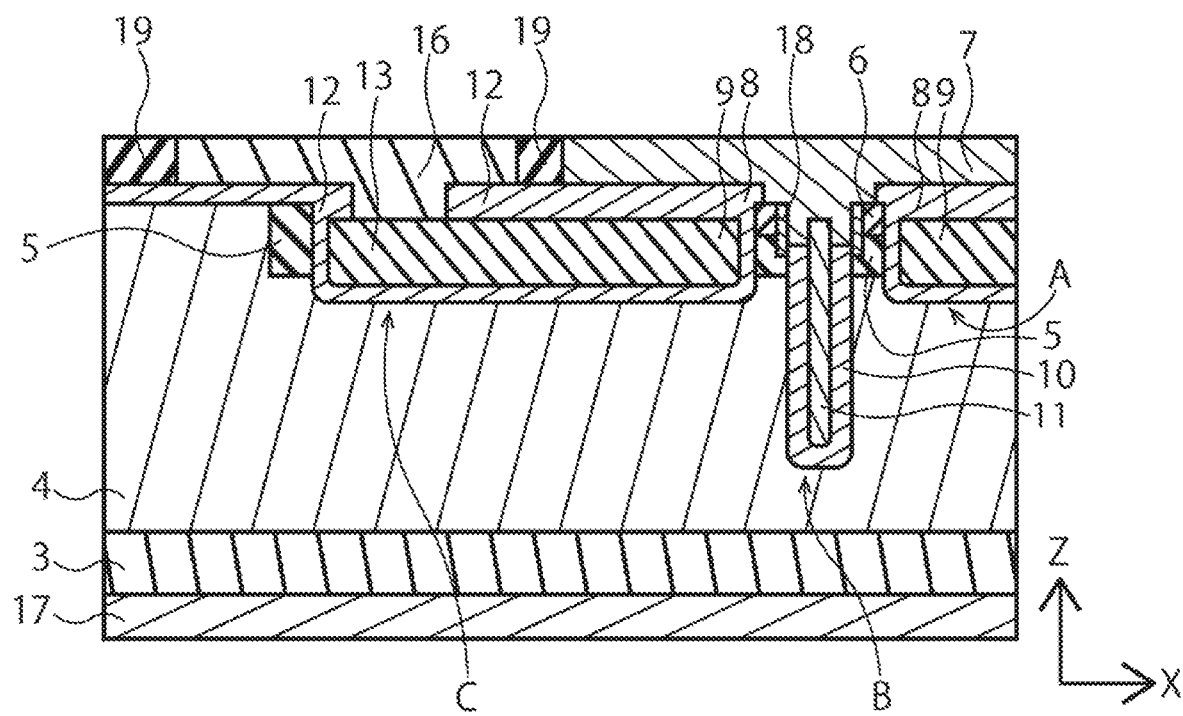
FIG. 3B is a cross-sectional view taken along a line e-e' in FIG. 1.

A first embodiment relates to a semiconductor device. FIGS. 1 to 3B illustrate cross-sectional views of principal portions of a semiconductor device 100 according to an embodiment. FIG. 1 is a drawing illustrating the principal portion of the semiconductor device 100. FIG. 1 illustrates a structure from an element region 1 to a terminal region 2. FIG. 2A is a cross-sectional view taken along a line a-a' in FIG. 1. FIG. 2B is a cross-sectional view taken along a line b-b' in FIG. 1. FIG. 2C is a cross-sectional view taken along a line c-c' in FIG. 1. FIG. 3A is a cross-sectional view taken along a line d-d' in FIG. 1. FIG. 3B is a cross-sectional view taken along a line e-e' in FIG. 1. Note that FIG. 1 is a cross-sectional view taken along a depth indicated by a line f-f' in FIG. 2A.

A first direction X, a second direction Y, and a third direction Z intersect each other. It is preferable that the first direction X, the second direction Y, and the third direction Z are orthogonal to each other.

The semiconductor device 100 illustrated in FIG. 1, FIGS. 2A, 2B and 2C, and FIGS. 3A and 3B includes the element region 1 including a plurality of semiconductor elements, and the terminal region 2 including a wiring portion of the element region. The semiconductor device 100 is, for example, a power MOSFET.

The semiconductor device 100 illustrated in FIG. 1 and FIGS. 2A to 2C includes a first semiconductor layer (drain layer) 3 of the first conductive type, a second semiconductor layer (drift layer) 4 of the first conductive type, first semiconductor regions (base regions) 5 of the second conductive type, second semiconductor regions (source regions) 6 of the first conductive type, a first electrode (source electrode) 7, first insulation films 8, second electrodes (gate electrodes) 9, second insulation films 10, first field plate electrodes (first FP) 11, third insulation films 12, third electrodes (terminal gate electrodes) 13, fourth insulation films 14, second field plate electrodes (second FP) 15, and a fourth electrodes (gate line layer) 16.

As illustrated in FIG. 1, the plurality of first field plate electrodes 11 having a dot pattern in cross section are arranged in a staggered pattern in a plane direction, and a plurality of patterns surrounding the first field plate electrodes 11 are regularly arranged. In FIG. 1, a portion where two of the second electrode 9 is interposed between two of the first field plate electrodes 11 corresponds to one semiconductor element. From the view point of improving the withstand voltage, it is preferable that a plurality of semiconductor elements are regularly arranged in the element region 1.

The first semiconductor layer (drain layer) 3 of the first conductive type is, for example, an n-type (n+ type) silicon layer. On one of the surfaces of the drain layer 3, the second semiconductor layer 4 is provided. On a surface of the first semiconductor layer 3 opposite from the surface where the second semiconductor layer 4 is provided, for example, a fifth electrode (drain electrode) 17 is provided. Examples of the material of the drain electrode 17 include titanium (Ti), nickel (Ni), gold (Au), silver (Ag), and aluminum (Al).

The second semiconductor layer (drift layer) 4 of the first conductive type is, for example, an n-type (n-type) silicon layer. The drift layer 4 is provided on the drain layer 3. The drain layer 3 and the drift layer 4 are layered in the third direction Z. The drift layer 4 includes one or a plurality of first trenches (gate tranches) A, a plurality of holes (FP holes) B, a plurality of second tranches (terminal gate trenches) C, and a plurality of third trenches (terminal FP trenches) D. The first trenches A, the holes B, the second trenches C, and the third trenches D do not penetrate through the drift layer 4. The trenches have a depth direction in the third direction Z, and extend in one or both of the first direction X and the second direction Y. The holes have a depth direction in third direction, and do not extend neither in the first direction X nor the second direction Y. In other words, the holes are arranged in a dot pattern in a cross section taken along the first direction X and the second direction Y. The first trenches A are, for example, a single trench having a plurality of cylindrical structures (annular structure in the first direction X and the second direction Y), which are continuously formed. The holes B are disposed in annular structures of the first trenches A, respectively. The second trenches C and the third trenches extend, for example, in a linear shape such as a straight line in the first direction X, and are regularly arranged, respectively.

The first semiconductor regions (base regions) 5 of the second conductive type correspond to the p-type regions provided on the drift layer 4. The base region 5 is selectively provided on the drift layer 4. The base region 5 is disposed between the first trenches A and the holes B. In the element region 1, the base region 5 surround the holes B, and are surrounded by the first trenches A. The base region 5 is disposed between the first insulation films 8 and the second insulation films 10. The base region 5, the first insulation films 8, and the second insulation films 10 are arranged in the first direction X and the second direction Y. The base region 5 and the drift layer 4 are arranged in the third direction Z. The base region 5 is a region formed, for example, by injecting p-type dopant in the drift layer 4. The first insulation films 8 and the third insulation film 12 are surrounded by the base region 5.

The second semiconductor regions (source regions) 6 of the first conductive type are regions of the n+ type provided on the base region 5. The source regions 6 are selectively provided on the base region 5. In the element region 1, the source regions 6 are arranged to surround the second electrodes 9 surrounded by the first insulation films 8. On the side of the source regions 6 opposite from the second electrodes 9, third semiconductor regions 18 of the p+ type (second conductive type) may be provided as base contacts. The source regions 6 are electrically connected to the first electrodes 7 via the third semiconductor regions 18. The source regions 6 and the base region 5 are arranged in the third direction Z. The base region 5 is interposed between the source regions 6 and the drift layer 4. The source regions 6 are regions formed, for example, by injecting n-type dopant into parts of the base region 5.

The first electrode (source electrode) 7 are electrodes of semiconductor elements electrically connected to the source regions 6. The plurality of semiconductor elements included in the element region 1 may be configured to have one common source electrode 7. The base region 5 and the source regions 6 are disposed between the source electrode 7 and the drift layer 4. Examples of the material of the source electrode 7 include aluminum (Al), copper (Cu), tungsten (W), and titanium (Ti).

The first insulation films (first gate insulation films) 8 and the second electrodes (gate electrodes) 9 are provided in the first trenches (gate trenches) A. The gate trenches A penetrate through the base region 5 and the source regions 6, and reach the drift layer 4. Bottom surfaces of the gate trenches A are in contact with the drift layer 4. Side surfaces of the gate trenches A are in contact with the drift layer 4, the base region 5, and the source regions 6. Inside the gate trenches A, the first gate insulation films 8 are formed along the gate trenches A. Ends of the gate trenches A are connected to the second trenches (terminal gate trenches) C.

The first gate insulation films 8 are insulation films arranged along the gate trenches A, and surrounding the gate electrodes 9. Inner peripheral sides of the gate insulation films 8 are in contact with the gate electrodes 9. Outer peripheral sides of the gate insulation films 8 are in contact with the drift layer 4, the base region 5, the source regions 6, and the source electrode 7. The gate insulation films 8 are surrounded by the base region 5 and the source regions 6.

The gate electrodes 9 are electrodes of the semiconductor elements arranged in the gate trenches A via the gate insulation films 8. The gate electrodes 9 are arranged in the gate trenches A extending in a net-shape, and thus constitute a continuous long wiring. Therefore, it is preferable that the paths of the gate electrodes 9, that is, the number of paths through which a current flow is increased, and thus the gate resistance is lowered. In a case where a plurality of the gate electrodes 9 are arranged in a stripe pattern, the gate resistance is lowered in the same manner. Examples of the material of the gate electrodes 9 include polysilicon.

The second insulation films (first FP insulation films) 10 and the first field plate electrodes (FP electrodes) 11 are provided in the holes (FP holes) B. The FP holes B do not extend in the first direction X and the second direction Y, and extend in the third direction Z, which is a depth direction. The shape of cross-section of the FP holes B (cross section taken along an X-Y plane) may be a polygon or a circle, and preferably, a regular polygon or a circle. The FP holes B penetrate through the base region 5, and reach the drift layer 4. Bottom surfaces of the FP holes B are in contact with the drift layer 4. Side surfaces of the FP holes B are in contact with the base region 5 and the drift layer 4. The side surfaces of the FP holes B may also be in contact with the base contacts 18. Inside the FP holes B, the first FP insulation films 10 are formed along the FP holes B. A plurality of the FP holes B are present in the element region 1. When symmetric property of the semiconductor elements is improved, distribution of the electric fields becomes homogeneous. Accordingly, concentration of the electric field is alleviated and thus the withstand voltage of the semiconductor elements is improved. From the view point of improving the withstand voltage of the semiconductor elements, it is preferable that a plurality of rows of the FP holes B are arranged in the first direction X. From the same view point, it is preferable that a plurality of rows of the FP holes B are arranged in the second direction Y. From the same view point, it is preferable that a plurality of rows of the FP holes B are arranged in the first direction X and a plurality of rows of the FP holes B are arranged in the second direction Y.

The first FP insulation films 10 are insulation films arranged along the FP holes B and surrounding the first FP electrodes 11. From the view point of improving the withstand voltage, it is preferable that the first FP insulation films 10 are thicker than the first gate insulation films. Inner peripheral sides of the first FP insulation films 10 are in contact with the first FP electrodes 11. Outer peripheral sides of the first FP insulation films 10 are in contact with and surrounded by the base region 5 and the drift layer 4. The outer peripheral sides of the first FP insulation films 10 may also be in contact with the base contacts 18 and further is surrounded by the base contacts 18. The first FP insulation films 10 open on an upper surfaces of the FP holes B to allow electrical connection between the first FP electrodes 11 and the source electrode 7. Examples of the material of the first FP insulation films 10 include silicon oxide ($SiO_2$).

The first FP electrodes 11 are a plurality of column-shaped electrodes provided in the element region 1. The first FP electrodes 11 are electrodes provided in the FP holes B. The first FP electrodes 11 are electrically connected to the source electrodes 7, and have the same potential as the source electrode 7. The first FP electrodes 11 are disposed with the gate electrodes 9 interposed therebetween. The first FP electrodes 11 are disposed in the FP holes B via the first FP insulation films 10. The first FP electrodes 11 are disposed in the plurality of the FP holes B, respectively. A contact metal, not illustrated, may be interposed between the first FP electrodes 11 and the source electrode 7. Examples of the material of the first FP electrodes 11 include polysilicon.

In the element region 1, patterns having the first FP electrodes 11 at the centers are arranged regularly. It is preferable that regular pattern helps to improve the symmetric property of each of the semiconductor elements, and thus to improve the withstand voltage of the elements. From the view point of improving the withstand voltage of the semiconductor elements, it is preferable that the distances between two or more of the first FP electrodes 11 adjacent to each other are the same. From the same view point, it is preferable that the distances between three or more of the first FP electrodes 11 adjacent to each other are the same. When the distance among the three of the first FP electrodes 11 adjacent to each other are the same, the centers of the three of the first FP electrodes 11 adjacent to each other correspond to vertices of a regular triangle. By equalizing the distance between the first FP electrodes 11, the symmetric property and the withstand voltage of the semiconductor element may be improved. It is preferable that the first FP electrodes 11 are arranged equidistantly in line in the first direction X and the second direction Y.

It is preferable that a cross-sectional shape of the first FP electrodes 11 is a regular polygon or a circle in terms of the symmetric property. However, the cross-sectional shape of the first FP electrodes 11 is not limited thereto.

From the view point of improving the withstand voltage of the semiconductor elements, it is preferable that the bottom surfaces of the FP holes B are positioned on the side closer to the drain layer 3 with respect to the bottom surfaces of the gate trenches A. In other words, with the FP holes B deeper than the gate trenches A, a depleted layer can extend easier and the withstand voltage is improved. From the view point of improving the withstand voltage, the bottom surfaces of the FP holes B and the bottom surfaces of the gate trenches A in a thickness direction of the drift layer 4 (a layering direction of the drift layer 4 and the drain layer 3, the third direction Z) is, when the withstand voltage is on the order of 100V, for example, from equal to or more than 2 μm to equal to or less than 7 μm, more preferably from equal to or more than 3 μm to equal to or less than 5 μm.

The third insulation films (second gate insulation films) 12 and the third electrodes (terminal gate electrodes) 13 are provided within the second trenches (terminal gate trenches) C. The terminal gate trenches C are positioned in the terminal region 2 adjacent to the element region 1. By increasing the withstand voltage of the gate wiring in the terminal region 2, the withstand voltage of the entire semiconductor device 100 may be improved. The terminal gate trenches C penetrate through the base region 5, and reach the drift layer 4. Bottom surfaces of the terminal gate trenches C are in contact with the drift layer 4. Side surfaces of the terminal gate trenches C are in contact with the base region 5 and the drift layer 4. The terminal gate trenches C are surrounded by the base region 5. Since the semiconductor element is not provided in the terminal region 2, the base contacts 18 are not included in the terminal region 2.

The terminal gate trenches C are connected to the ends of the gate trenches A. A plurality of the terminal gate trenches C are provided in the drift layer 4, are arranged in a stripe pattern, and extend in the first direction X. From the view point of improving the symmetric property of the terminal region 2, it is preferable that the plurality of gate trenches C are arranged in parallel. An extending direction of the terminal gate trenches C are preferably in the first direction X. Considering the symmetric property and the withstand voltage, it is preferable that a row of the FP holes B arranged in the first direction X and the terminal gate trenches C are arranged on a straight line. In the element region 1 and the terminal region 2, it is preferable that the width of the terminal gate trenches C is the same as the width of the gate trenches A in order to improve the withstand voltage. From the same view point, it is preferable that the depth of the terminal gate trenches C is the same as the depth of the gate trenches A.

From the view point of improving the withstand voltage of the semiconductor device 100, it is preferable that the gate electrodes have high symmetric property also in the terminal gate trenches C. Specifically, it is preferable that the lengths of the plurality of terminal gate trenches C in the first direction X (the length of the long side) are the same.

Note that the boundaries between the gate trenches A and the terminal gate trenches C correspond to the boundary between the element region 1 and the terminal region 2. The boundary between the element region 1 and the terminal region 2 is defined as a virtual line connecting ends of the third trenches D on the first FP electrodes 11 side. A region on the first FP electrodes 11 side from the boundary corresponds to the element region 1. A region on the second field plate electrodes (second FP electrodes) 15 side from the boundary corresponds to the terminal region 2.

The second gate insulation films 12 are insulation films disposed along the terminal gate trenches C, and surrounding the terminal gate electrodes 13. Inner peripheral sides of the second gate insulation films 12 are in contact with the terminal gate electrodes 13. Outer peripheral sides of the second gate insulation films 12 are surrounded by the base region 5. The outer peripheral sides of the second gate insulation films 12 are in contact with the base region 5 and the drift layer 4. The second gate insulation films 12 are connected to the first gate insulation films 8. Examples of the material of the second gate insulation films 12 include silicon oxide ($SiO_2$).

The terminal gate electrodes 13 are electrodes disposed within the terminal gate trenches C via the second gate insulation films 12. The terminal gate electrodes 13 are a plurality of electrodes extending in the first direction X from ends of the first gate insulation films 8 in the first direction, disposed in the terminal gate trenches C via the second gate insulation films 12, and extending in the first direction X from the ends of the gate electrodes 9 in the first direction X. The terminal gate electrodes 13 are directly and electrically connected to the gate electrodes 9. The terminal gate electrodes 13 are a plurality of electrodes extending in the first direction X in a stripe pattern. Examples of the material of the terminal gate electrodes 13 include polysilicon.

Figure 4A:
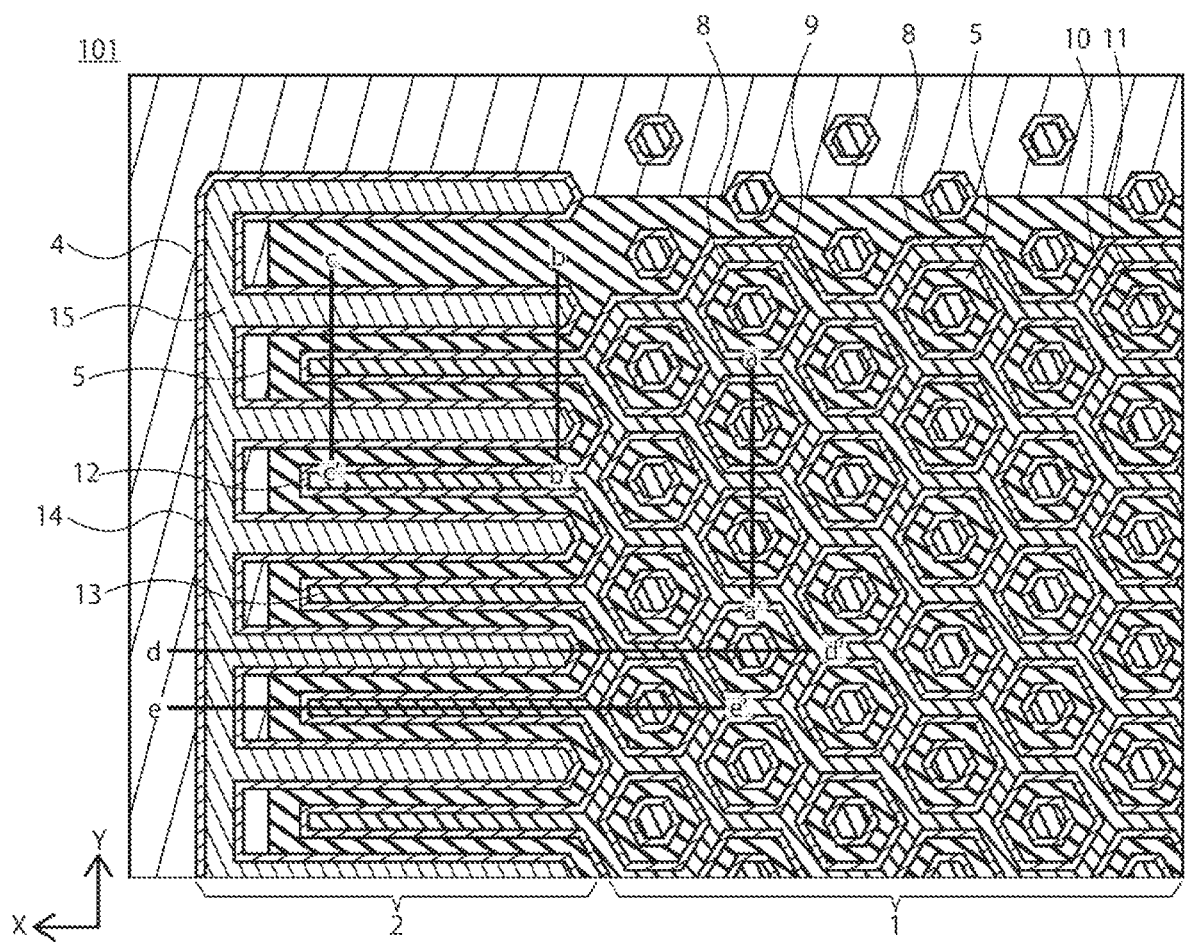
FIG. 4A is a drawing illustrating a principal portion of a semiconductor device 101 according to an embodiment.
Figure 4B:
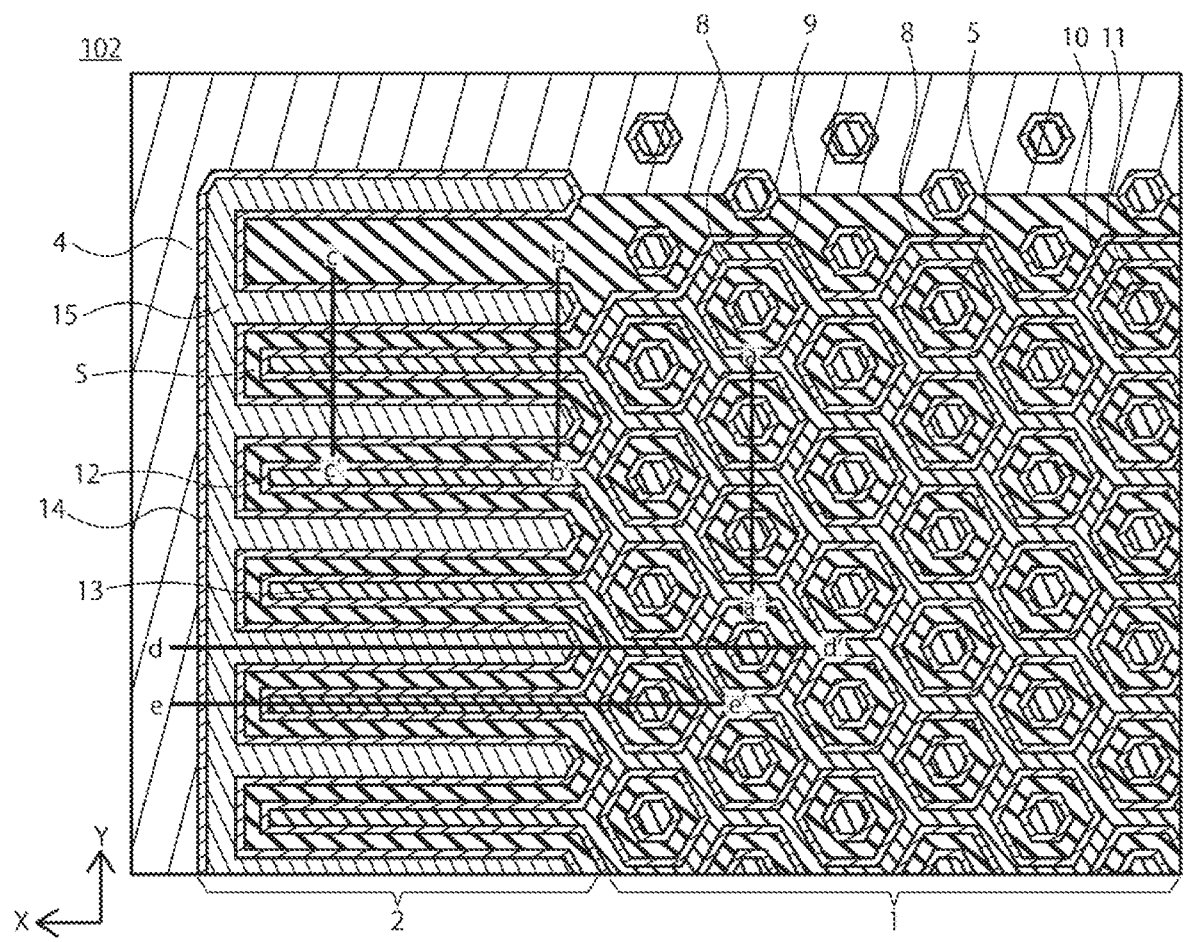
FIG. 4B is a drawing illustrating a principal portion of a semiconductor device 102 according to an embodiment.

The fourth insulation films (second FP insulation films) 14 and the second field plate electrodes (second FP electrodes) 15 are provided in the third trenches (terminal FP trenches) D. The third trenches D are positioned in the terminal region 2. A plurality of the terminal FP trenches D are provided in the drift layer 4, and interpose or surround the terminal gate trenches C. The cross-sectional view of a principal portion of the semiconductor device 101 according to the embodiment in FIG. 4A illustrates a mode in which the terminal FP trenches D surround the terminal gate trenches C, and a part of drift layer 4 is placed between the base region 5 and the second FP electrodes 15. The cross-sectional view of a principal portion of the semiconductor device 102 according to the embodiment in FIG. 4B illustrates a mode in which the terminal FP trenches D surround the terminal gate trenches C. The terminal FP trenches D are spaced apart from the FP holes B. It is preferable that the FP trenches D extend in the first direction X in the same manner as the terminal gate trenches C. Considering the symmetric property and the withstand voltage, a row of the FP holes B arranged in the first direction X and one of the terminal FP trenches D are arranged in line in the first direction X. From the view point of improving the symmetric property and withstand voltage of the semiconductor device 100, it is preferable that the depth (the distance in the third direction Z) of the terminal FP trenches D is the same as the depth (the distance in the third direction Z) of the FP trenches B. From the same view point, it is preferable that the width of the terminal FP trenches D is the same as the width of the FP trenches B. From the same view point, it is also preferable that the terminal FP trenches D are arranged in parallel with the terminal gate trenches C. In other words, the second FP electrodes 15 are arranged in parallel with the terminal gate electrode 13.

The terminal gate trenches C are interposed between or surrounded by the terminal FP trenches D. From the view point of improving the withstand voltage, it is preferable that the ends of the terminal gate trenches C on the side opposite from the gate trenches A (distal ends of the terminal gate trenches C) in an extending direction of the terminal gate trenches are positioned closer to the gate trenches A side than the ends (the distal ends of the second FP electrodes 15) of the second FP electrodes 15 on the opposite side from the gate trenches A side. When the distal ends of the second FP electrodes 15 are positioned closer to the gate trenches A side than the distal ends of the terminal gate trenches C, the distal ends of the terminal gate trenches C protrude from the second FP electrodes 15 in the first direction X, which is the extending direction. If the distal ends of the terminal gate trenches C protrude from the second FP electrodes 15 in the extending direction, the withstand voltage is less likely improved, and the electric fields are more likely concentrated on the second gate insulation films 12, which may often be a weak point of the semiconductor device 100. Accordingly, the distal ends of the second FP electrodes 15 are positioned on the gate trenches A side with respect to the distal ends of the terminal gate trenches C in the extending direction, and the distal ends of the second FP electrodes 15 protrude by a range from equal to or more than 3 μm to equal to or less than 8 μm, more preferably equal to or more than 4 μm to equal to or less than 6 μm, in the first direction X, which is a direction of extension of the terminal gate trenches C when the withstand voltage is on the order of 100V, for example, from the distal ends of the terminal gate trenches C. It is preferable that the distance of protrusion of the distal ends of the second FP electrodes 15 from the distal ends of the terminal gate trenches C in a direction in which the terminal FP trenches D extend is the same distance for the plurality of terminal FP trenches D. Note that a plurality of extending portions are present also when the terminal gate trenches C are surrounded by the terminal FP trenches D. Therefore, when surrounded by the terminal FP trenches D, the second FP insulation films 14 and the second FP electrodes 15 are disposed in the semiconductor device 100.

With the base region 5, which is the second conductive type surrounding the gate trenches A, positioned between the terminal gate trenches C and the terminal FP trenches D, the withstand voltage in the terminal region 2 also improves in the same manner as in the element region 1. In other words, the first gate insulation films 8, the second gate insulation films 12, and the second FP insulation films 14 are surrounded by the base region 5. In the terminal region 2, with the base region 5, the terminal gate trenches C, and the terminal FP trenches D arranged as in the embodiment, the withstand voltage of the terminal region 2 is improved. For example, in a case where the base region 5 is not disposed between the terminal gate trenches C and the terminal FP trenches D, the withstand voltage in the terminal region 2 may be lowered, or the electric fields in the second gate insulation films 12 may be increased and thus breakdown may occur even when the terminal FP trenches D are formed, so that the terminal region 2 may often be a weak point of the semiconductor device 100. Note that the drift layer 4 is provided in the terminal region 2, outside the base region 5.

The second FP insulation films 14 disposed along the terminal FP trenches D and configured to surround the second FP electrodes 15. Inner peripheral sides of the second FP insulation films 14 are in contact with the second FP electrodes 15. From the view point of improving the withstand voltage, it is preferable that the second FP insulation films 14 are thicker than the second gate insulation films 12. Outer peripheral sides of the second FP insulation films 14 are surrounded by the base region 5. The outer peripheral sides of the second FP insulation films 14 are in contact with the base region 5 and the drift layer 4.

The second FP electrodes 15 are electrodes arranged in the terminal FP trenches D via the second FP insulation films 14. The second FP electrodes 15 are a plurality of electrodes extending in a stripe pattern in the first direction X. The second FP electrodes 15 are in direct contact with the source electrode 7. The second FP electrodes 15 are electrically connected to the first FP electrodes 11 via the source electrode 7. The second FP electrodes 15 have the same potential as the source electrode 7 and the first FP electrodes 11. The base region 5 is disposed between the second FP electrodes 15 and the terminal gate electrodes 13. From the view point of improving the withstand voltage by improving the symmetric property of the semiconductor device 100, it is preferable that at least two of the first FP electrodes 11 are arranged in line, and these arranged two or more first FP electrodes 11 are arranged in a straight line with the second FP electrodes 15.

The terminal gate electrodes 13 are interposed between, or surrounded by the second FP electrodes 15. From the view point of improving the withstand voltage, it is preferable that in an extending direction of the second FP trenches (an extending direction of the terminal gate electrodes 13), the ends of the terminal gate electrodes 13 on the side opposite from the gate trenches A side (distal ends of the terminal gate electrodes 13) are positioned closer to the gate trenches A than the ends (distal ends of the second FP electrodes 15) of the second FP electrodes 15 on the opposite side from the gate trenches A. When the distal ends of the second FP electrodes 15 are positioned closer to the gate trenches A than the distal ends of the terminal gate electrodes 13, the distal ends of the terminal gate electrodes 13 protrude from the distal ends of the second FP electrodes 15 in the first direction X, which is the extending direction. If the distal ends of the terminal gate electrodes 13 protrude from the distal ends of the second FP electrodes 15 in the extending direction, the withstand voltage is less likely improved, and the electric fields are more likely concentrated on the second gate insulation films 12, which may often be a weak point of the semiconductor device 100. Accordingly, the distal ends of the second FP electrodes 15 are positioned on the gate trenches A side with respect to the distal ends of the terminal gate electrodes 13 in the extending direction, and the distal ends of the second FP electrodes 15 protrude by a range from equal to or more than 3 µm to equal to or less than 8 µm, more preferably, equal to or more than 4 µm to equal to or less than 6 µm in the direction in which the second FP electrodes 15 extend, when the withstand voltage is on the order of 100V, for example, from the distal ends of the terminal gate electrodes 13. It is preferable that the distance of protrusion of the distal ends of the second FP electrodes 15 from the distal ends of the terminal gate electrodes 13 in a direction in which the terminal gate electrodes 13 extend is the same distance for the plurality of second FP electrodes 15.

The fourth electrode (gate line layer) 16 is an electrode electrically connected to the plurality of terminal gate electrodes 13. The terminal gate electrodes 13 are disposed between the gate line layer 16 and the drift layer 4. The gate line layer 16 is disposed in line with the source electrode 7. In order to avoid electrical connection between the gate line layer 16 and the source electrode 7, a fifth insulation film 19 is disposed between the gate line layer 16 and the source electrode 7. Examples of the material of the gate line layer 16 include aluminum (Al), copper (Cu), and tungsten (W). Examples of the material of the fifth insulation film 19 include silicon oxide ($SiO_2$).

The above semiconductor device 100 may be configured as described below.

The semiconductor includes:

a plurality of first column-shaped members (holes B, first FP electrodes 11, and first FP insulation films 10) including a plurality of first conductive layers, the first conductive layers each extending in a depth direction of the semiconductor substrate (drift layer 4), the plurality of first column-shaped members being arranged to have the same distance to adjacent three of the first column-shaped members;

first gates (gate trenches A, first gate electrodes 9, and first gate insulation films 8) disposed along, and at a constant distance from, outer peripheral edges of the plurality of first column-shaped members;

a base layer (base region 5) provided between the plurality of first column-shaped members and the first gates;

source layers (source regions 6) in electrical conduction with the plurality of first conductive layers, and connected to the base layer;

a plurality of second gates (terminal gate trenches C, terminal gate electrodes 13, and second gate insulation films 12) extending in a first direction from the first gates and provided at the same pitches; and a plurality of second column-shaped members (terminal FP trenches D, second FP electrodes 15, and second FP insulation films 14) arranged in a stripe pattern, extending in the depth direction of the semiconductor device, provided at the same pitches, and having a plurality of second conductive layers, the plurality of second column-shaped members being provided alternately with the plurality of second gates.

The above semiconductor device 100 may be configured as described below.

The semiconductor includes:

a first electrode 7 provided in an element region 1 and terminal region 2 surrounding the element region 1;

a second electrode 17 provided in an element region 1 and terminal region 2 surrounding the element region 1;

a first semiconductor layer 4 of a first conductive type, the first semiconductor layer 4 being provided between the first electrode 7 and the second electrode 17;

a first semiconductor region 5 of a second conductive type, the first semiconductor region 5 being provided between the first electrode 7 and the first semiconductor layer 4;

a second semiconductor region 6 of the first conductive type, the second semiconductor region 6 being provided between the first electrode 7 and the first semiconductor region 5, a first electrode member 11 being positioned in the element region 1, a second electrode member 15 being positioned in the terminal region 2, the second electrode member being connected electrically to the first electrode member 11;

a plurality of third electrodes 9 provided among the first semiconductor layer 4, the first semiconductor region 5, the second semiconductor region 6, and the first electrode 7 via a first insulation film 8; and a forth electrode 16 provided between the second electrode member 15, the forth electrode 16 being provided between the first semiconductor layer 4 and the first semiconductor region 5 via a second insulation film 10.

Second Embodiment

Figure 5:
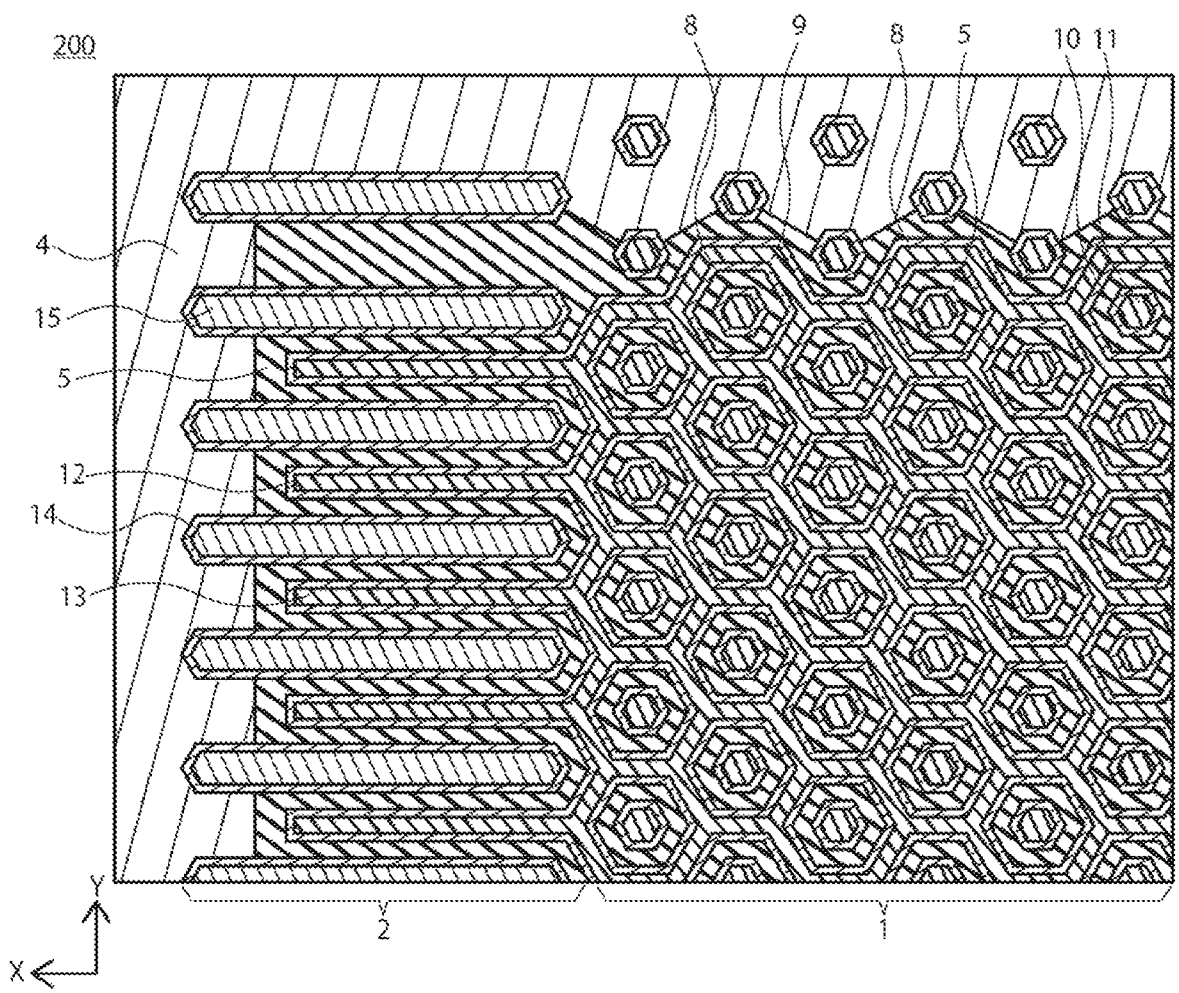
FIG. 5 is a drawing illustrating a principal portion of a semiconductor device 200 according to an embodiment.

A second embodiment relates to a semiconductor device. FIG. 5 is a cross-sectional view of a principal portion of a semiconductor device 200 according to an embodiment. The semiconductor device 200 of the second embodiment is a modification of the semiconductor device 100 of the first embodiment.

In the semiconductor device 200, a pattern of the base region 5 surrounding the outer periphery of the element region 1 extends along an outer peripheral pattern of the gate trenches A. In addition, in the outer periphery of the element region 1, the base region 5 extends in a direction vertical to surfaces of the first FP electrodes 11. For example, by enhancing the symmetric property of the outer peripheral portion of the element region 1 as in the second embodiment, further improvement of the withstand voltage of the semiconductor device 200 is achieved.

Third Embodiment

Figure 6:
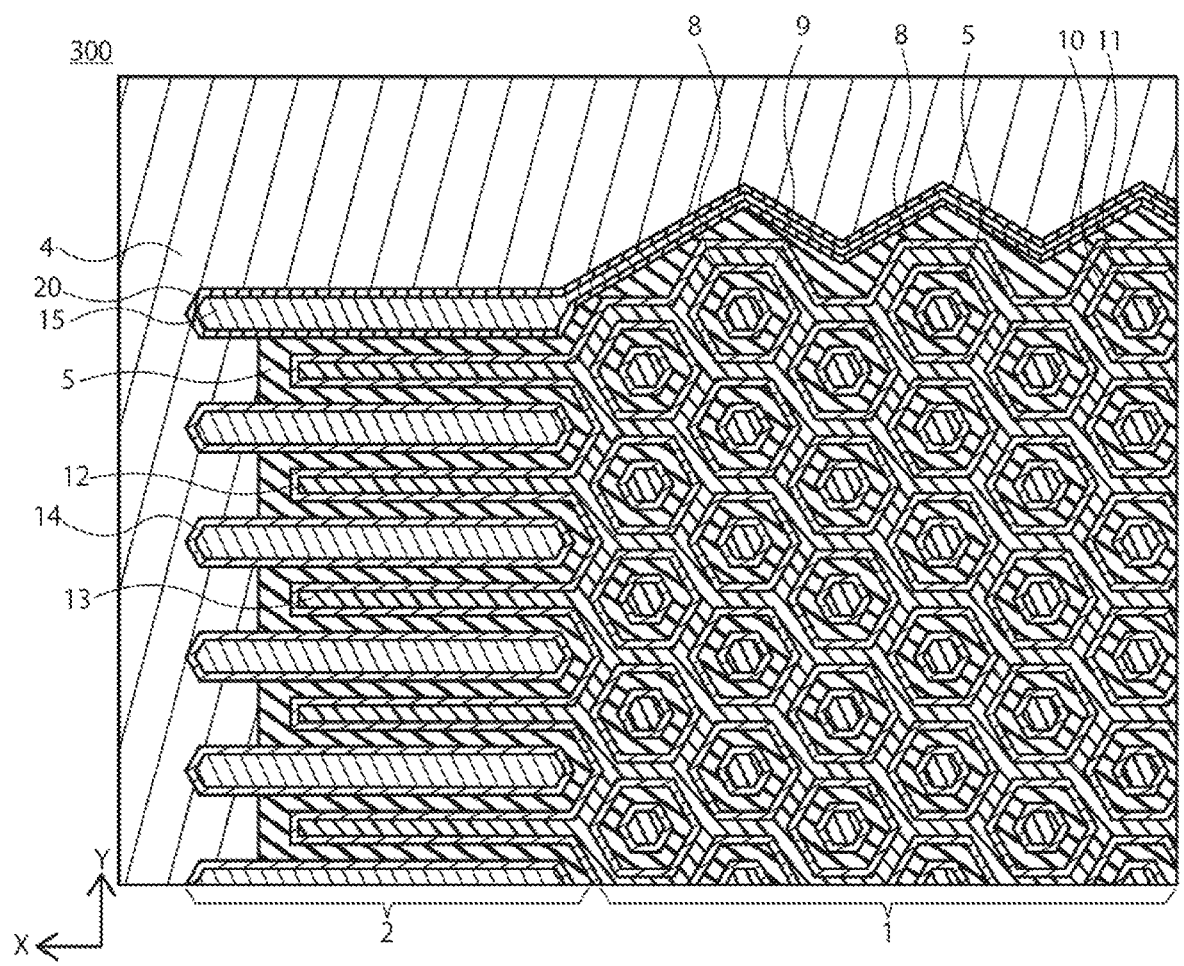
FIG. 6 is a drawing illustrating a principal portion of a semiconductor device 300 according to an embodiment.

A third embodiment relates to a semiconductor device. FIG. 6 is a cross-sectional view of a principal portion of a semiconductor device 300 according to an embodiment. The semiconductor device 300 of the third embodiment is a modification of the semiconductor device 100 of the first embodiment.

In the semiconductor device 300, sixth insulation films (third FP insulation films) 20 disposed in the terminal FP trenches D at both ends extend along an outer peripheral pattern of the gate trenches A. The second FP electrodes 15 extend also in the element region 1. For example, by enhancing the symmetric property of the outer peripheral portion of the element region 1 as in the third embodiment, further improvement of the withstand voltage of the semiconductor device 300 is achieved. Examples of the material of the third FP insulation films 20 include silicon oxide ($SiO_2$).

Fourth Embodiment

Figure 7:
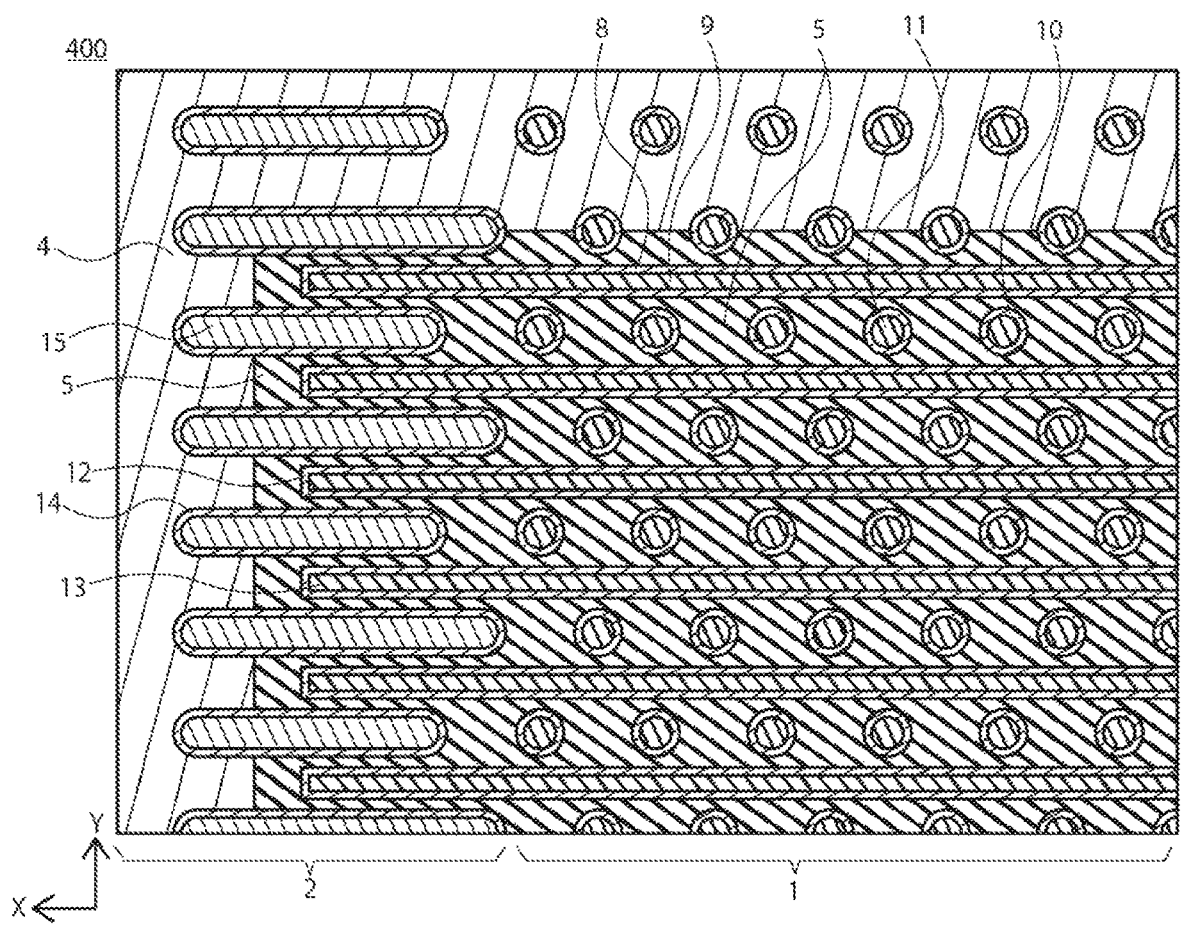
FIG. 7 is a drawing illustrating a principal portion of a semiconductor device 400 according to an embodiment.

A fourth embodiment relates to a semiconductor device. FIG. 7 is a cross-sectional view of a principal portion of a semiconductor device 400 according to an embodiment. The semiconductor device 400 of the fourth embodiment is a modification of the semiconductor device 100 of the first embodiment.

In the semiconductor device 400, the FP holes B have a circular shape, and the plurality of gate trenches A arranged in a stripe pattern extend in the first direction X so as to interpose the circular first FP electrodes 11 therebetween. The improvement of the withstand voltage is achieved in both regions of the element region 1 and the terminal region 2 of the semiconductor device 400 also by arranging the gate trenches A in a stripe pattern instead of the net shape.

Fifth Embodiment

Figure 8:
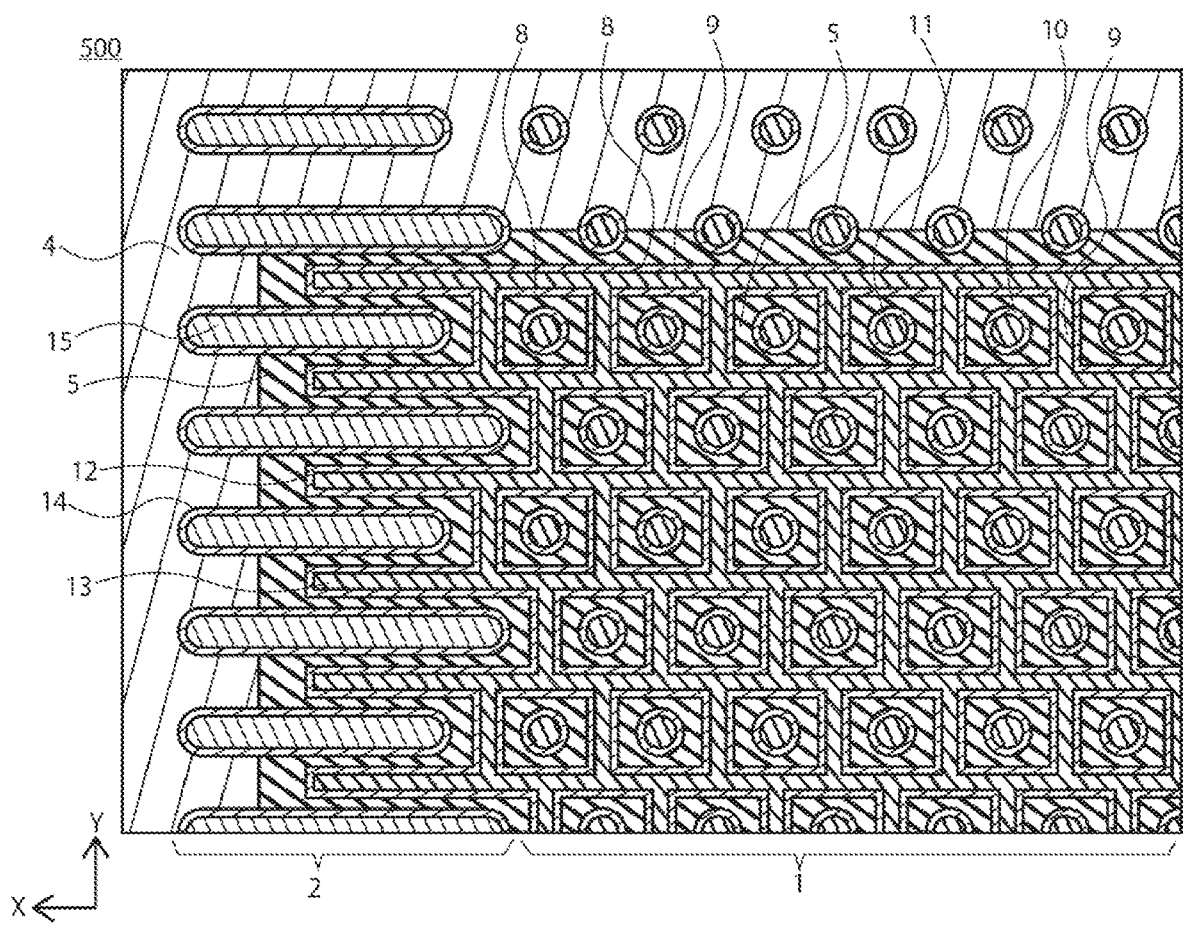
FIG. 8 is a drawing illustrating a principal portion of a semiconductor device 500 according to an embodiment.

A fifth embodiment relates to a semiconductor device. FIG. 8 is a cross-sectional view of a principal portion of a semiconductor device 500 according to an embodiment. The semiconductor device 500 of the fifth embodiment is a modification of the semiconductor device 400 of the fourth embodiment.

In the semiconductor device 500, improvement of the withstand voltage in the element region 1 is achieved also by employing the gate trenches A in which rectangular patterns are assembled, and improvement of the withstand voltage of the semiconductor device 500 is achieved by employing a structure which improves the withstand voltage also in the terminal region 2.

While certain embodiments have been described, these embodiments have been presented by way of example only, and are not intended to limit the scope of the inventions. Indeed, a printed board described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor layer of a first conductive type;
   a second semiconductor layer of the first conductive type, the second semiconductor layer being provided on the first semiconductor layer and including a first trench, a plurality of holes, a plurality of second trenches, and a plurality of third trenches;
   a first semiconductor region of a second conductive type, the first semiconductor region being provided on the second semiconductor layer;
   a second semiconductor region of the first conductive type, the second semiconductor region being provided on the first semiconductor region;
   a first electrode electrically connected to the second semiconductor region;
   a second electrode disposed in the first trench via a first insulation film;
   a plurality of first field plate electrodes having a column shape, the first field plate electrodes being electrically connected to the first electrode, interposing the second electrode, and being disposed in the holes via a second insulation film;

a plurality of third electrodes extending from ends of the first insulation films in a first direction to the first direction, the third electrodes being disposed in the second trenches via third insulation films and extending from ends of the second electrode in the first direction to the first direction;

a plurality of second field plate electrodes extending in the first direction, the second field plate electrodes being apart from the first field plate electrodes, being disposed in the third trenches via fourth insulation films, being electrically connected to the first field plate electrode via the first electrode, and interposing the third electrode; and a fourth electrode electrically connecting the second electrode and the third electrode, wherein the second field plate electrodes extend in a stripe pattern in a direction which is along to a surface of the second semiconductor layer, and the second electrode is in direct contact with the third electrodes.

2. The semiconductor device according to claim 1, wherein the first semiconductor region is disposed between the second field plate electrodes and the third electrodes.

3. The semiconductor device according to claim 1, wherein the first insulation films and the third insulation films are surrounded by the first semiconductor region.

4. The semiconductor device according to claim 1, further comprising a fifth electrode connected to the first semiconductor layer.

5. The semiconductor device according to claim 1, wherein the second field plate electrodes are arranged in parallel with the third electrodes.

6. The semiconductor device according to claim 1, wherein at least two or more of the first field plate electrodes are arranged in a row, and the two or more of the arranged first field plate electrodes are arranged in a straight line with the second field plate electrodes.

7. The semiconductor device according to claim 1, wherein in an extending direction of the second trenches, ends of the second trenches on an opposite side from the first trench are positioned closer to the first trench than the ends of the second field plate electrodes on an opposite side from the first trench.

8. The semiconductor device according to claim 1, wherein in the extending direction of the second trenches, ends of the second trench on an opposite side from the first trench side are positioned close to the first trench than the ends of the second field plate electrodes on the opposite side from the first trench, and the ends of the second field plate electrodes on the opposite side from the first trench protrude from the ends of the second trenches opposite from the first trench in the direction in which the third trenches extend by a range from equal to or more than 3 μm to equal to or less than 8 μm.

9. The semiconductor device according to claim 1, wherein the first insulation films and the third insulation films have an equal thickness.

10. The semiconductor device according to claim 1, wherein the second insulation films and the fourth insulation films have an equal thickness.

11. The semiconductor device according to claim 1, wherein the second insulation films are thicker than the first insulation films.

12. The semiconductor device according to claim 1, wherein the first field plate electrodes are arranged in the first direction and a second direction which is orthogonal to the first direction and a third direction, the first field plate electrodes extend in a third direction which is orthogonal to the first direction and the second direction, the first semiconductor layer and the second semiconductor layer are layered in the third direction.

13. The semiconductor device according to claim 1, a length of the second field plate electrodes in a first direction is larger than a length of the third electrode in a first direction.

14. The semiconductor device according to claim 12, wherein the holes do not extend in the first direction and the second direction.

15. The semiconductor device according to claim 1, wherein the third electrodes are surrounded by the first semiconductor region.

16. The semiconductor device according to claim 1, wherein each of the third electrodes is in direct contact with the second electrode.

17. The semiconductor device according to claim 1, wherein a distance from a bottom of the second field plate electrodes to a surface of the first semiconductor layer which faces the second semiconductor layer is smaller than a distance from a bottom of the second electrode to a surface of the first semiconductor layer which faces the second semiconductor layer, and a distance from a bottom of the second field plate electrodes to a surface of the first semiconductor layer which faces the second semiconductor layer is smaller than a distance from a bottom of the third electrodes to a surface of the first semiconductor layer which faces the second semiconductor layer.

18. The semiconductor device according to claim 1, wherein the first semiconductor region is disposed between the second field plate electrodes and the second electrode in the first direction.

19. A semiconductor device comprising:
a first semiconductor layer of a first conductive type;
a second semiconductor layer of the first conductive type, the second semiconductor layer being provided on the first semiconductor layer and including a first trench, a plurality of holes, a plurality of second trenches, and a plurality of third trenches;
a first semiconductor region of a second conductive type, the first semiconductor region being provided on the second semiconductor layer;
a second semiconductor region of the first conductive type, the second semiconductor region being provided on the first semiconductor region;
a first electrode electrically connected to the second semiconductor region;
a second electrode disposed in the first trench via a first insulation film;
a plurality of first field plate electrodes having a column shape, the first field plate electrodes being electrically connected to the first electrode, interposing the second electrode, and being disposed in the holes via a second insulation film;
a plurality of third electrodes extending from ends of the first insulation films in a first direction to the first direction, the third electrodes being disposed in the second trenches via third insulation films and extending from ends of the second electrode in the first direction to the first direction;
a plurality of second field plate electrodes extending in the first direction, the second field plate electrodes being apart from the first field plate electrodes, being disposed in the third trenches via fourth insulation films, being electrically connected to the first field plate electrode via the first electrode, and interposing the third electrode; and
a fourth electrode electrically connecting the second electrode and the third electrode,
wherein the third electrodes extend in the first direction in a stripe shape pattern from ends of the second electrode,
each of the third electrodes is disposed between the second field plate electrodes,
the first semiconductor region is disposed between the second field plate electrodes and the third electrodes,
the third electrodes are surrounded by the first semiconductor region, and
the second field plate electrodes extend in a stripe pattern in a direction which is along to a surface of the second semiconductor layer, and the second electrode is in direct contact with the third electrodes.

20. The semiconductor device according to claim 19, wherein the first field plate electrodes are arranged in the first direction and a second direction which is orthogonal to the first direction and a third direction,
the first field plate electrodes extend in a third direction which is orthogonal to the first direction and the second direction,
the first semiconductor layer and the second semiconductor layer are layered in the third direction.

21. The semiconductor device according to claim 19, a length of the second field plate electrodes is larger than a length of the third electrode.

22. The semiconductor device according to claim 20, wherein the holes do not extend in the first direction and the second direction.

\* \* \* \* \*